(12) United States Patent
Olesiewicz et al.

(10) Patent No.: US 7,474,528 B1
(45) Date of Patent: Jan. 6, 2009

(54) CONFIGURABLE FLOW CONTROL AIR BAFFLE

(75) Inventors: Timothy W. Olesiewicz, Dublin, CA (US); M. Sean White, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 185 days.

(21) Appl. No.: 11/401,611

(22) Filed: Apr. 10, 2006

(51) Int. Cl.
*H05K 7/20* (2006.01)
(52) U.S. Cl. ............... 361/695; 361/694; 454/184
(58) Field of Classification Search ............... None
See application file for complete search history.

(56) References Cited

U.S. PATENT DOCUMENTS

| | | | | | |
|---|---|---|---|---|---|
| 5,077,601 | A | * | 12/1991 | Hatada et al. | 257/722 |
| 5,410,448 | A | * | 4/1995 | Barker et al. | 361/695 |
| 5,774,330 | A | * | 6/1998 | Melton et al. | 361/683 |
| 6,018,458 | A | * | 1/2000 | Delia et al. | 361/690 |
| 6,155,920 | A | * | 12/2000 | Pan et al. | 454/184 |
| 6,504,718 | B2 | * | 1/2003 | Wu | 361/695 |
| 6,744,632 | B2 | * | 6/2004 | Wilson et al. | 361/695 |
| 6,936,767 | B2 | * | 8/2005 | Kleinecke et al. | 174/50 |
| 7,256,993 | B2 | * | 8/2007 | Cravens et al. | 361/690 |
| 7,345,873 | B2 | * | 3/2008 | Dey et al. | 361/695 |

* cited by examiner

*Primary Examiner*—Gregory D Thompson
(74) *Attorney, Agent, or Firm*—Hickman Palermo Truong & Becker LLP (57) ABSTRACT

A configurable flow control air baffle comprises one or more removable flow impedance devices that affect the direction of airflow forced through a computer system, wherein the position of the one or more flow impedance devices are user-configurable. Various embodiments comprise various shapes, sizes and attachment configurations of the flow impedance devices. Hence, the airflow through computer systems is controllable by a user based on the different configurations of the components within respective computer systems. According to one embodiment, the removable flow impedance devices are user-configurable on the baffle by removably attaching the flow impedance devices to a baffle face, such as in one or more housing mechanisms. According to one embodiment, the removable flow impedance devices are user-configurable on the baffle by permanently decoupling, from the baffle, one or more preconfigured permanently removable flow impedance devices.

20 Claims, 10 Drawing Sheets

CONFIGURABLE FLOW CONTROL AIR BAFFLE

BACKGROUND

Some components of computing equipment, such as processors, require cooling to dissipate the heat generated during operation. Typically, cooling air (or possibly other gases) is forced through the equipment via one or more fan assemblies, thereby helping to cool the internal components of the equipment. In typical computer systems, the forced airflow may flow over and/or bypass certain components, for example, due to the configuration of the computer components and the size of the enclosure housing the components. Thus, in response to such a scenario, the airflow through the equipment is often controlled and directed to certain regions, and in some cases through the fins of a heat sink, via an internal air baffle mechanism.

When component configurations within a computer system vary, the airflow through the equipment is not readily manageable to compensate for the configuration variation because the air baffle configuration is fixed. For example, for equipment enclosures that support different sets of components at varying locations, e.g., two different motherboards and corresponding sockets that can be installed in the same chassis, the airflow will typically bypass some components in some configurations because of the fixed-configuration air baffle. In other words, the direction of the airflow through the equipment is not configurable based on the configuration of the components within the equipment.

One approach to directing airflow through computing equipment based on the configuration of components installed within the equipment is to install "dummy" components within the equipment enclosure in the place of real components, to simulate a consistent component configuration. Such an approach is intended to force the airflow to behave as if the equipment is fully populated. However, different "dummy" parts are needed for each different component being simulated and, therefore, raising issues regarding inventory in the field, maintainability, etc. Furthermore, the "dummy" parts are installed in the same manner as the actual component being simulated (e.g., in a DIMM slot on a motherboard) and, therefore, can damage parts on the mating board (e.g., a socket) and consequently prevent use for future upgrades, affect reliability, etc. Based on the foregoing, there is room for improvements in the control and management of airflow through computing equipment.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

A configurable flow control air baffle comprises one or more removable flow impedance devices that affect the direction of airflow forced through a computer system, wherein the position of the one or more flow impedance devices are user-configurable. Various embodiments comprise various shapes, sizes and attachment configurations of the flow impedance devices. Hence, the airflow through computer systems is controllable by a user based on the different configurations of the components within different computer systems.

According to one embodiment, the removable flow impedance devices are user-configurable on the baffle by removably attaching the flow impedance devices to a baffle face, such as in one or more housing receptacles. According to one embodiment, the removable flow impedance devices are user-configurable on the baffle by permanently detaching, from the baffle, one or more preconfigured permanently removable flow impedance devices.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENT(S)

In the following description, for purposes of explanation, numerous specific details are set forth in order to provide a thorough understanding of the present invention. It will be apparent, however, that the present invention may be practiced without these specific details. In other instances, well-known structures and devices may be shown in block diagram form in order to avoid unnecessarily obscuring the present invention.

Examples of 'Fully Configured' Computer System and Baffle Configurations

Figure 1A:
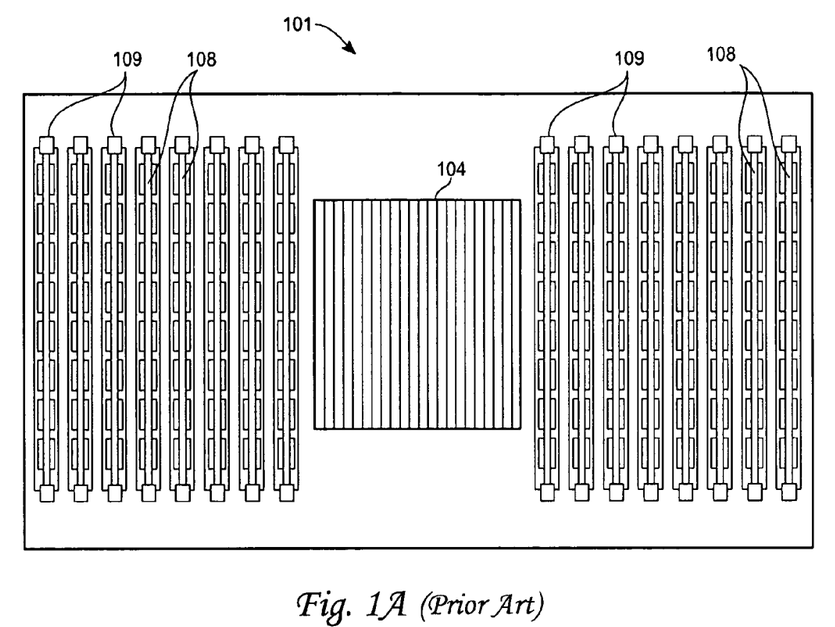
FIG. 1A is a top view illustrating a first prior art configuration of a computer system.
Figure 1B:
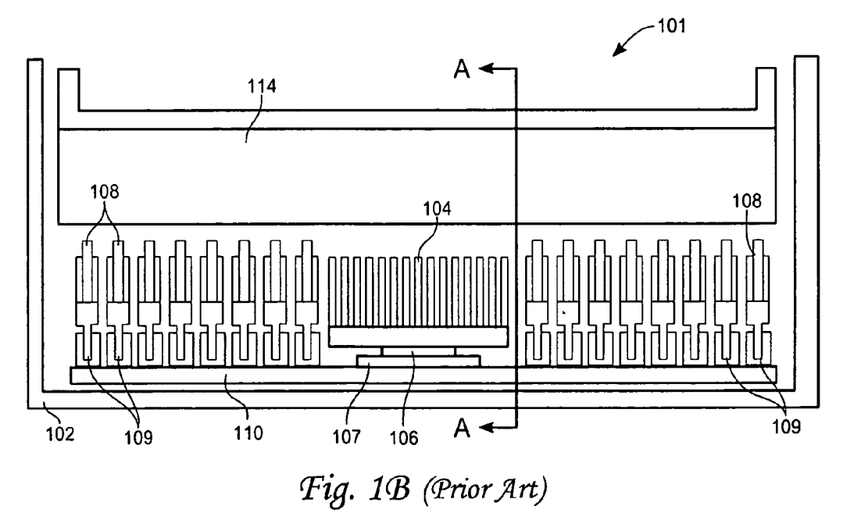
FIG. 1B is a front or back view illustrating a prior art baffle installed in the first configuration of the computer system of FIG. 1A.
Figure 1C:
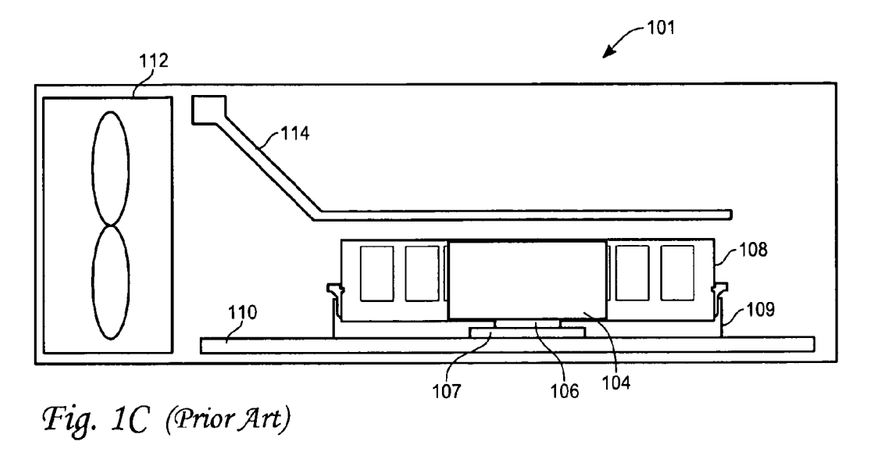
FIG. 1C is a section view illustrating a prior art baffle installed in the first configuration of the computer system of FIG. 1A.

FIG. 1A is a top view illustrating a first "full" configuration of a computer system; FIG. 1B is a front or back view illustrating a prior art baffle installed in the configuration of the computer system of FIG. 1A; and FIG. 1C is a section view taken along line A-A of FIG. 1B illustrating a prior art baffle installed in the configuration of the computer system of FIG. 1A. FIGS. 1A-1C are used herein as a non-limiting general example of a computer system configuration for which embodiments may be implemented.

FIGS. 1A-1C illustrate a computer system 101 configuration comprising an enclosure 102 enclosing a heat sink 104 associated with a processor 106 installed in a corresponding processor socket 107, eight memory modules 108 on each side of heat sink 104 and processor 106 and installed in corresponding memory module sockets 109, a printed circuit assembly 110 to which processor 106 and memory modules 108 are communicatively coupled, a cooling fan 112 and a prior art air baffle 114.

The shape of air baffle 114 is such that forced airflow from cooling fan 112 is directed downward, over and through the components of computer system 101. The air baffle 114 is depicted configured within computer system 101 over the various components shown.

Figure 2A:
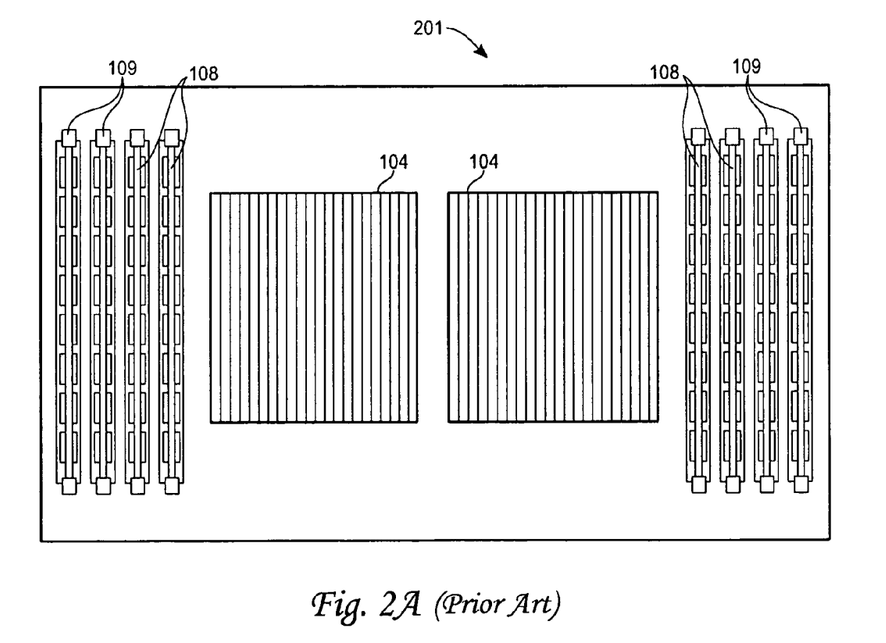
FIG. 2A is a top view illustrating a second configuration of a computer system.
Figure 2B:
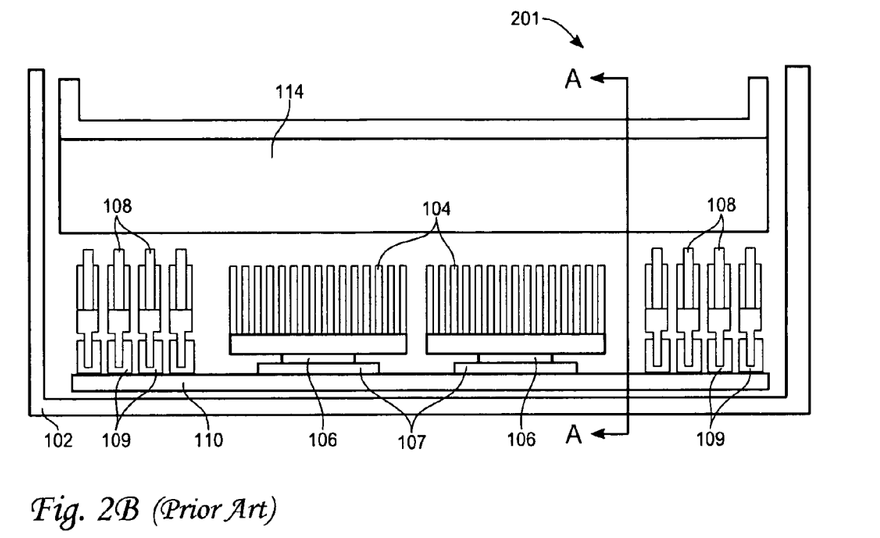
FIG. 2B is a front or back view illustrating a prior art baffle installed in the second configuration of the computer system of FIG. 2A.
Figure 2C:
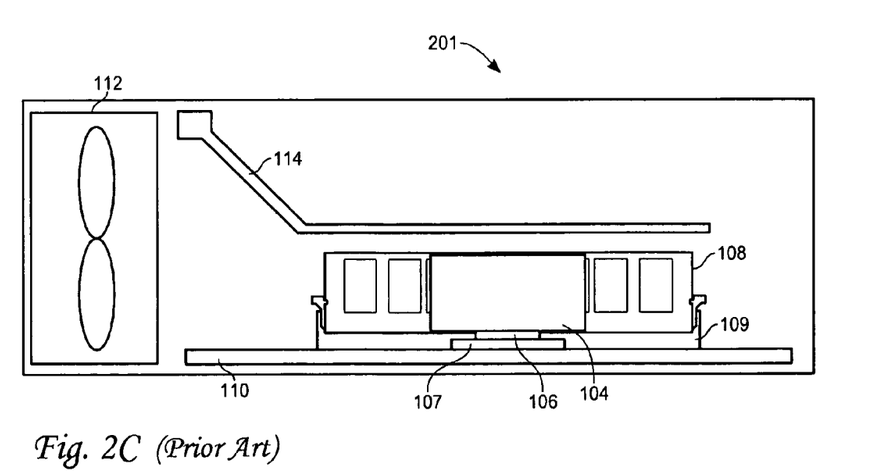
FIG. 2C is a section view illustrating a prior art baffle installed in the second configuration of the computer system of FIG. 2A.

FIG. 2A is a top view illustrating a configuration of a computer system; FIG. 2B is a front or back view illustrating a prior art baffle installed in the configuration of the computer system of FIG. 2A; and FIG. 2C is a section view taken along line A-A of FIG. 2B illustrating a prior art baffle installed in the configuration of the computer system of FIG. 2A. FIGS. 2A-2C are used herein as a non-limiting general example of a computer system configuration for which embodiments may be implemented.

FIGS. 2A-2C illustrate a second "full" computer system 201 configuration comprising an enclosure 102 enclosing two heat sinks 104 associated with respective processors 106 installed in corresponding processor sockets 107, four memory modules 108 on each side of heat sinks 104 and processors 106 and installed in corresponding memory module sockets 109, a printed circuit assembly 110 to which processors 106 and memory modules 108 are communicatively coupled, a cooling fan 112 and a prior art air baffle 114. The shape of air baffle 114 is again such that forced airflow from cooling fan 112 is directed downward, over and through the components of computer system 201, with the air baffle 114 depicted configured within computer system 201 over the various components shown.

The number and type of components illustrated in FIGS. 1A-1C and FIGS. 2A-2C are non-limiting and are for purposes of example. Thus, use of embodiments of the invention are in no way limited to use in computer systems configured exactly as computer systems 101 and 201. Significantly, embodiments may be implemented for use with virtually any computer system configuration, and specifically adapted for each such use.

Figure 6A:
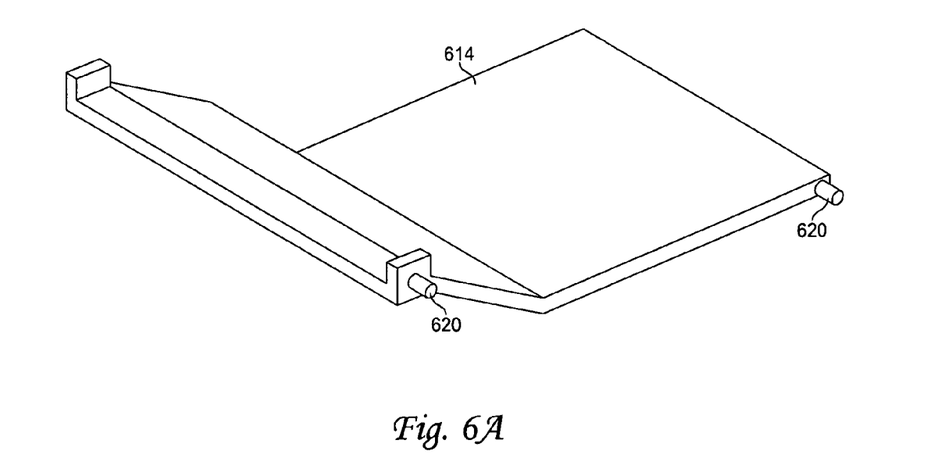
FIG. 6A is a top isometric view of a configurable baffle, according to an embodiment.
Figure 6B:
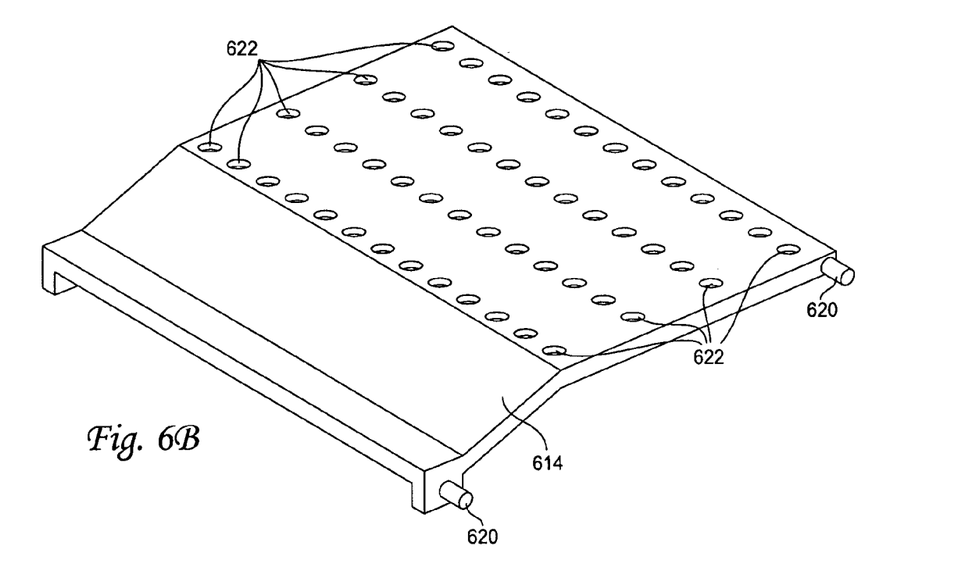
FIG. 6B is a bottom isometric view of a configurable baffle, according to an embodiment.

Configurable Airflow Baffle FIG. 6A is a top isometric view of a configurable baffle 614, according to an embodiment. In one embodiment, configurable baffle 614 comprises attach pins 620 on each side. Pins 620 are used for attaching baffle 614 to a corresponding computer system, such as to enclosure 102 (FIG. 1), so that the baffle 614 can rotate about pins 620. In FIGS. 6A and 6B, pins 620 are shown on the sides of baffle 614 at both forward and rear locations. However, the exact configuration of pins 620 on configurable baffle 614 may vary from implementation to implementation. Thus, configurable baffle 614 may be configured with pins 620 at a forward location or at a rear location, for rotatably attaching configurable baffle 614 to a corresponding computer system. Additionally, configurable baffle 614 can be prefabricated to include sets of pins 620 at both forward and rear locations, whereby one of the sets of pins 620 can be removed to suit the needs of particular computer systems. Pins 620 provide the capability to rotate configurable baffle 614 up and away from the inside of a computer system, thereby providing simple access to the inside of the computer system to ease configuration and maintenance of the computer system, as well as simple access to the flow impedance devices for ease in configuring and reconfiguring the baffle.

FIG. 6B is a bottom isometric view of configurable baffle 614, according to an embodiment. According to one embodiment, configurable baffle 614 comprises housing receptacles 622 on the underside of a substantially planar portion of the baffle. Housing receptacles 622 facilitate simple and flexible configuring of the baffle 614, whereby different shapes and sizes of flow impedance devices can readily be attached to, and detached from, the planar portion of the configurable baffle 614. The size, shape and configuration of housing receptacles 622 may vary from implementation to implementation. However, a grid-like pattern of housing receptacles 622, as depicted in FIG. 6B, provides flexibility and reusability with respect to configuring baffle 614 with different shapes, sizes and locations of flow impedance devices based on the needs of varying computer systems.

According to one embodiment, rather than implementing a configurable baffle with housing receptacles 622 for attaching flow impedance devices to and detaching flow impedance devices from the planar portion of the baffle, a configurable baffle is preconfigured with flow impedance devices at baffle fabrication time. The preconfigured baffle could be configured, at fabrication time, with a specific configuration of flow impedance devices that corresponds to the needs associated with a specific computer system component configuration. Alternatively, the preconfigured baffle could be configured, at fabrication time, with a 'full set' of flow impedance devices that can be permanently removed (e.g., snapped off) to suit the needs associated with a specific computer system component configuration. For example, the preconfigured baffle may include some configuration of flow impedance devices coupled both laterally and longitudinally to the planar portion of the baffle to suit the needs associated with various common component configurations, whereby some of the preconfigured flow impedance devices can be permanently removed to suit the needs associated with a particular component configuration.

A non-limiting advantage of using a configurable air baffle as described herein, rather than using dummy components, is that there is no need to install dummy components into the sockets of a mating board. Therefore, the sockets will not be damaged by the use of such dummy components and, consequently, the sockets are likely to have a longer and more reliable lifecycle. Another non-limiting advantage of using a configurable air baffle is that a large inventory of unique dummy parts are not needed in the field to substitute for corresponding real parts, for purposes of directing airflow. Rather, a relatively few number of flow impedance devices may be used for directing airflow for many different computer system component configurations.

Examples of 'Partially Configured' Computer System and Baffle Configurations

(A) Example A

Figure 3A:
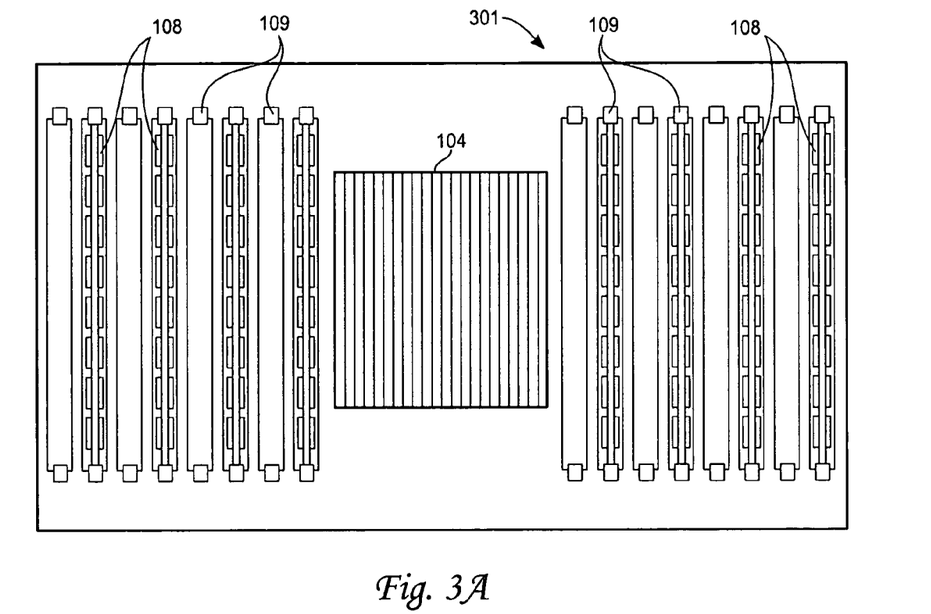
FIG. 3A is a top view illustrating a third configuration of a computer system of FIG. 1A.
Figure 3B:
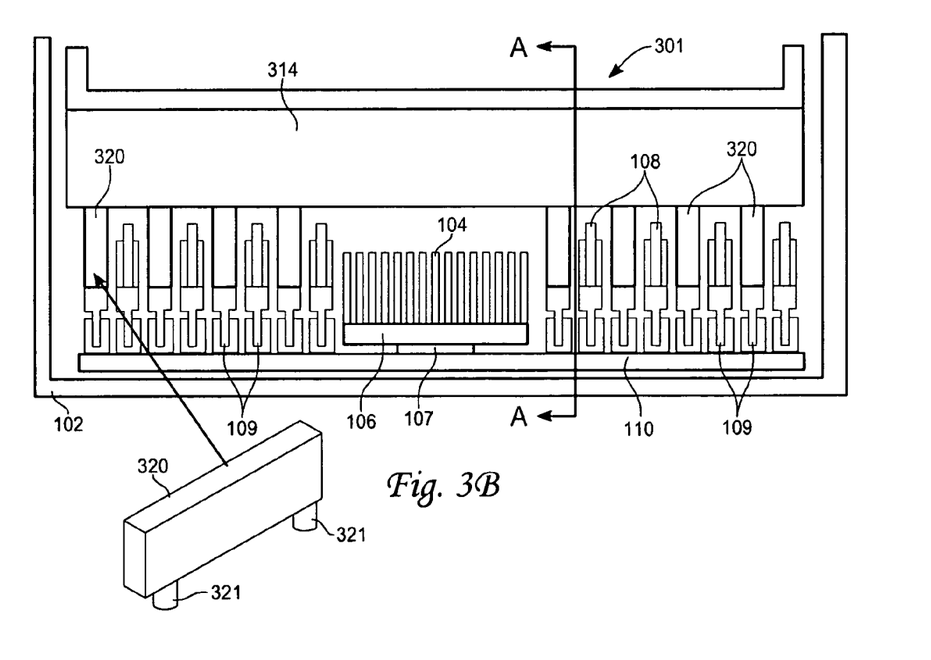
FIG. 3B is a front or back view illustrating a configurable baffle installed in the third configuration of the computer system of FIG. 3A, according to an embodiment.
Figure 3C:
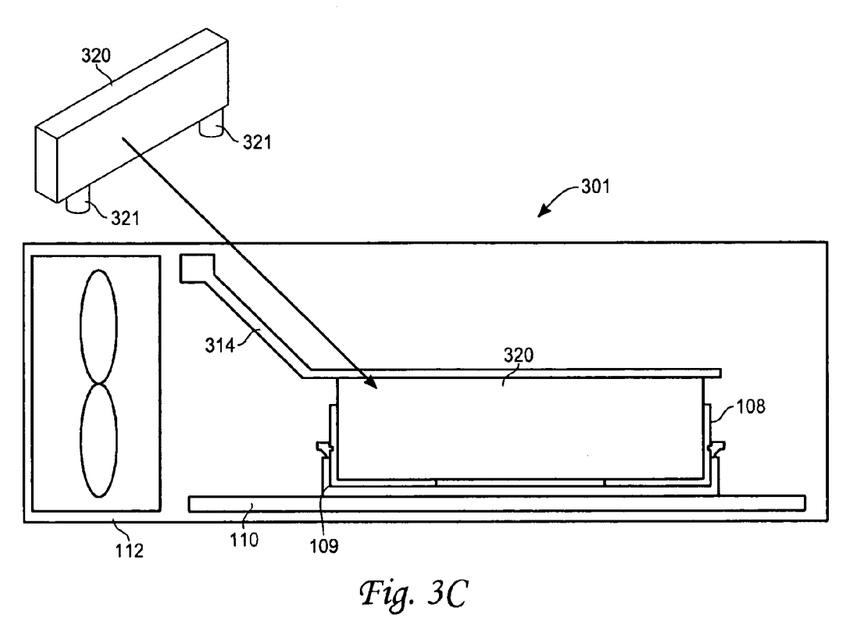
FIG. 3C is a section view illustrating a configurable baffle installed in the third configuration of the computer system of FIG. 3A, according to an embodiment.

FIG. 3A is a top view illustrating a third configuration of a computer system (i.e., a first "partial" configuration); FIG. 3B is a front or back view illustrating a configurable baffle 314 installed in the third configuration; and FIG. 3C is a section view taken along line A-A of FIG. 3B illustrating the configurable baffle 314 installed in the third configuration. The computer system configuration depicted in FIGS. 3A-3C is used herein as a non-limiting example of a computer system configuration for which embodiments may be implemented.

FIGS. 3A-3C illustrate a first "partial" computer system 301 configuration comprising an enclosure 102 enclosing a heat sink 104 associated with a processor 106 installed in a corresponding processor socket 107, four memory modules 108 on each side of heat sink 104 and processor 106 and installed in corresponding memory module sockets 109, a printed circuit assembly 110 to which processor 106 and memory modules 108 are communicatively coupled, a cooling fan 112 and a configurable air baffle 314.

Note that only alternating memory module sockets 109 actually house memory modules 108. Therefore, in the configuration depicted, alternating memory module sockets 109 are not used to house corresponding memory modules 108. Consequently, if baffle 114 is used with the configuration of FIG. 3A, the forced airflow from cooling fan 112 would take a different path than the forced airflow would take with the configuration of FIG. 1A. Taking paths of lesser resistance, the airflow in relation to baffle 114 would tend toward paths over the unused memory module sockets 109, thus largely bypassing and avoiding the installed components (i.e., alternating memory modules 108). That is not a desirable scenario because the effect of such airflow is diminished in its ability to cool the installed components because most of the airflow flows through the vacant volumes rather than over and around (i.e., coming close to or into contact with) the components needing cooling.

FIGS. 3B and 3C illustrate an embodiment in which a plurality of blocks 320 are coupled to air baffle 314. Blocks 320 are also referred to herein as flow impedance devices because the blocks impede the airflow in certain areas in which the blocks are installed. In the configuration of FIGS. 3B and 3C, each of blocks 320 is coupled to air baffle 314 so that the block 320 fills the otherwise vacant volume above each unused memory module socket 109. In this configuration of air baffle 314, blocks 320 are generally installed longitudinally parallel to the airflow, similar to memory modules 108. By impeding, or blocking, the airflow through the corresponding volumes that each block 320 fills, more of the forced airflow from cooling fan 112 is directed to flow in contact with or near the components actually installed in the system 301.

Blocks 320 are depicted as removably attached to air baffle 314 via attachment stubs 321, which dispose within housing receptacles inset in air baffle 314. Thus, a user in the field is able to configure air baffle 314 and attached blocks 320 in a manner according to the specific component configuration of computer system 301. Hence, if the configuration of system 301 is changed, then the configuration of blocks 320 on air baffle 314 can readily be changed accordingly. The housing receptacles, according to one embodiment, are shown in greater detail in FIG. 6B.

As discussed, blocks 320 may be permanently attached rather than removably attached to air baffle 314. Further, blocks 320 may be attached to air baffle 314 in a prefabricated "factory" configuration by the baffle manufacturing process (e.g., molded with the baffle) so that unnecessary blocks can be permanently removed (e.g., broken off) from air baffle 314 according to the specific component configuration of computer system 301, i.e., the preconfigured blocks that would otherwise interfere with installed components are removed from the "factory-configured" air baffle 314 prior to installing air baffle 314 into system 301.

(B) Example B

Figure 4A:
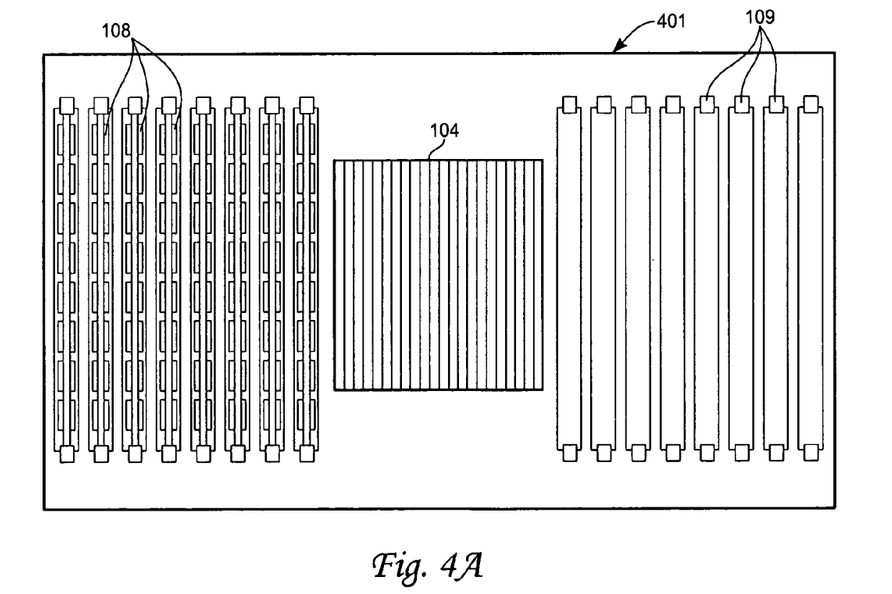
FIG. 4A is a top view illustrating a fourth configuration of a computer system of FIG. 1A.
Figure 4B:
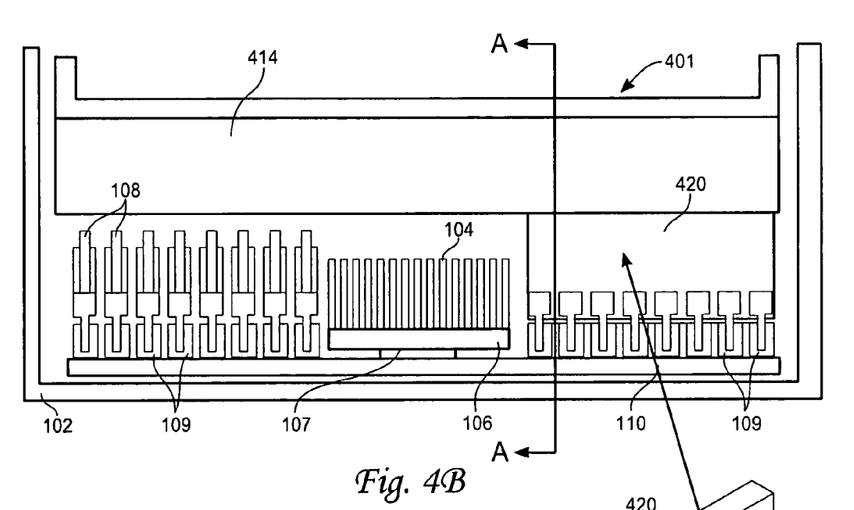
FIG. 4B is a front or back view illustrating a configurable baffle installed in the fourth configuration of the computer system of FIG. 4A, according to an embodiment.
Figure 4C:
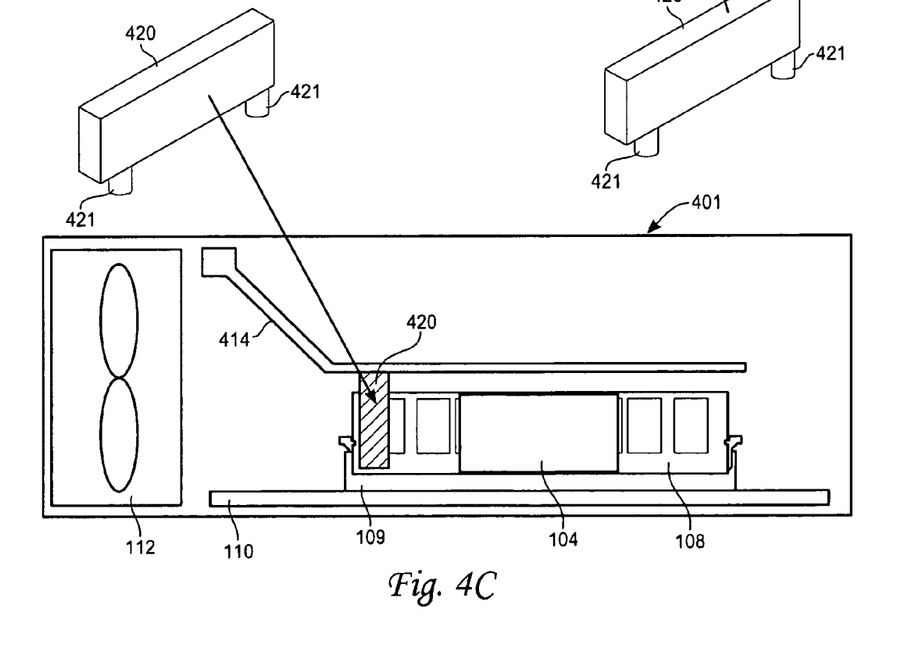
FIG. 4C is a section view illustrating a configurable baffle installed in the fourth configuration of the computer system of FIG. 4A, according to an embodiment.

FIG. 4A is a top view illustrating a fourth configuration of a computer system (i.e., a second "partial" configuration); FIG. 4B is a front or back view illustrating a configurable baffle 414 installed in the fourth configuration; and FIG. 4C is a section view taken along line A-A of FIG. 4B illustrating the configurable baffle 414 installed in the fourth configuration. The computer system configuration depicted in FIGS. 4A-4C is used herein as a non-limiting example of a computer system configuration for which embodiments may be implemented.

FIGS. 4A-4C illustrate a second "partial" computer system 401 configuration comprising an enclosure 102 enclosing a heat sink 104 associated with a processor 106 installed in a corresponding processor socket 107, eight memory modules 108 on only one side of heat sink 104 and processor 106 and installed in corresponding memory module sockets 109, a printed circuit assembly 110 to which processor 106 and memory modules 108 are communicatively coupled, a cooling fan 112 and a configurable air baffle 414.

Note that all the memory module sockets 109 on only one side (left side as depicted in FIG. 4A) of the system 401 actually house memory modules 108. Therefore, in the configuration depicted, memory module sockets 109 on the other side (right side as depicted in FIG. 4A) are not used to house corresponding memory modules 108. Consequently, if air baffle 114 is used with the configuration of FIG. 4A, the forced airflow from cooling fan 112 would take a different path than the forced airflow would take with the configuration of FIG. 1A. As discussed in reference to computer system 301 with air baffle 114, the airflow would tend toward paths over the unused memory module sockets 109, thus bypassing to a large extent the installed components (i.e., left-side memory modules 108, processor 106 and heat sink 104), which is not a desirable scenario for the same reasons.

FIGS. 4B and 4C illustrate an embodiment in which a single block 420 is coupled to air baffle 414. Block 420 is also referred to herein as a flow impedance device because the block impedes the airflow in certain areas in which the block is located. In the configuration of FIGS. 4B and 4C, block 420 is coupled to air baffle 414 so that the block 420 generally blocks airflow to the vacant volume above the eight unused memory module sockets 109. Block 420 is generally installed longitudinally perpendicular to the airflow. By impeding, or blocking, the airflow in and around the corresponding volume that block 420 fills, more of the forced airflow from cooling fan 112 is directed to flow in contact with or near the components actually installed in the system 401. Configurable baffle 414 may be the same baffle as configurable baffle 314, but with blocks configured differently, i.e., the same 'main' baffle structure may be used with different attached flow impedance device configurations.

Block 420 is depicted as removably attached to air baffle 314 via attachment stubs 421, which dispose within housing receptacles inset in air baffle 414. Thus, a user in the field is able to configure air baffle 414 and attached block 420 in a manner according to the specific component configuration of computer system 401. Hence, if the configuration of system 401 is changed, then the configuration of blocks on air baffle 414 can be readily changed accordingly. The housing receptacles, according to one embodiment, are shown in greater detail in FIG. 6B.

As discussed, block 420 may be permanently attached rather than removably attached to air baffle 414. Further, block 420 may be attached to air baffle 414 in a prefabricated "factory" configuration by the baffle manufacturing process (e.g., molded with the baffle) so that unnecessary blocks can be removed (e.g., broken off) from air baffle 414 according to the specific component configuration of computer system 401, i.e., the preconfigured blocks that would otherwise interfere with installed components are removed from the "factory-configured" air baffle 414 prior to installing air baffle 414 into system 401.

(C) Example C

Figure 5A:
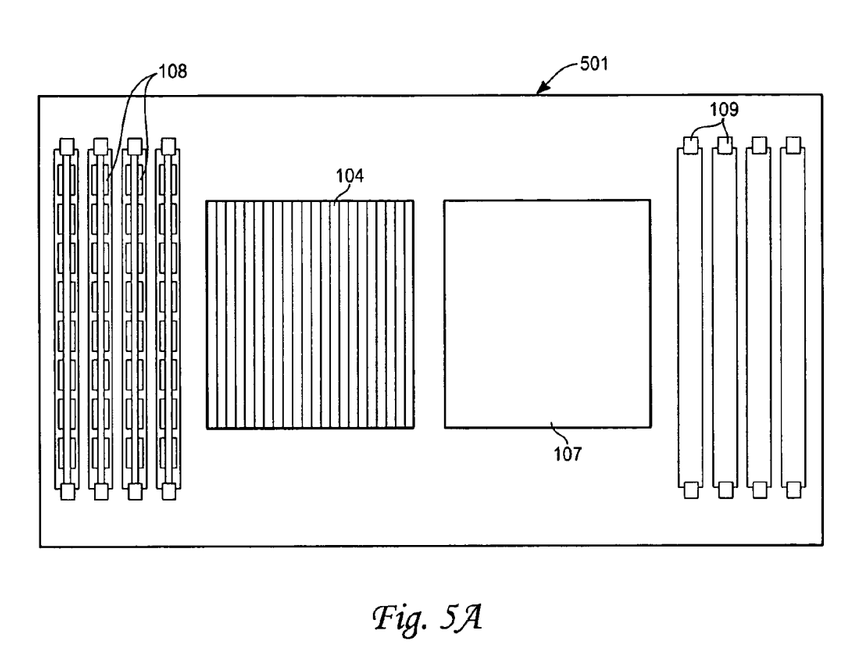
FIG. 5A is a top view illustrating a fifth configuration of a computer system of FIG. 2A.
Figure 5B:
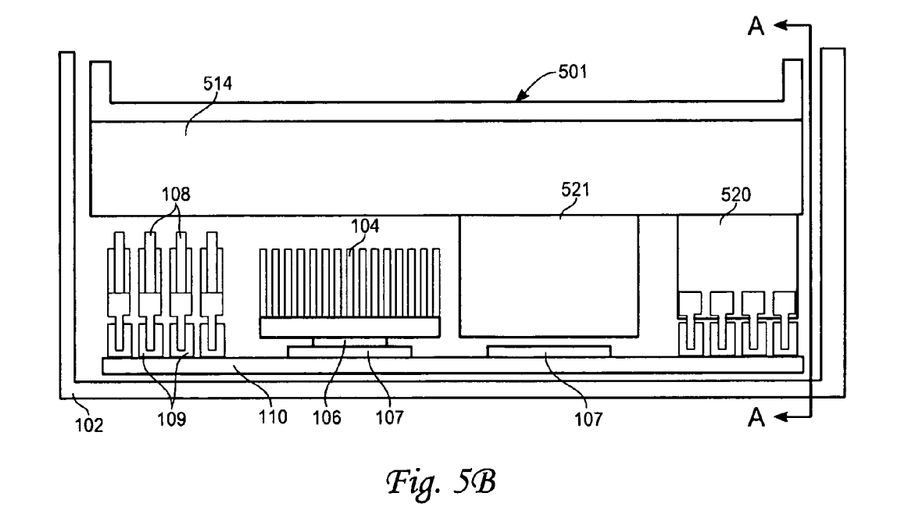
FIG. 5B is a front or back view illustrating a configurable baffle installed in the fifth configuration of the computer system of FIG. 5A, according to an embodiment.
Figure 5C:
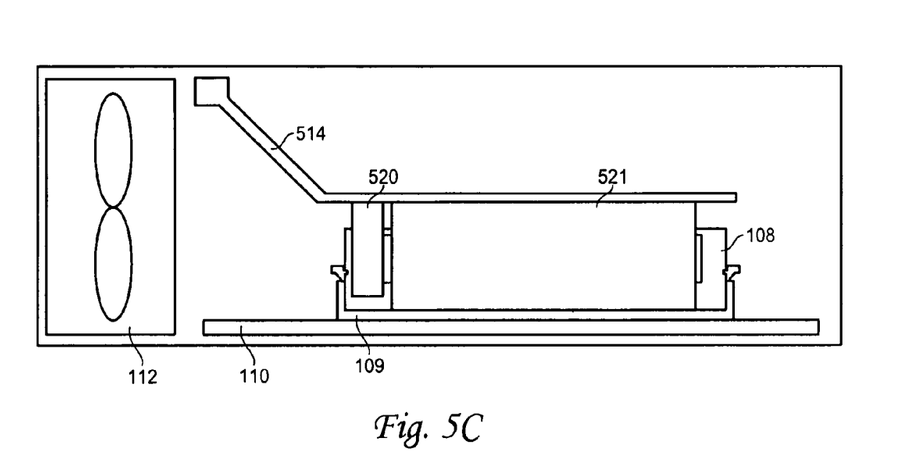
FIG. 5C is a section view illustrating a configurable baffle installed in the fifth configuration of the computer system of FIG. 5A, according to an embodiment.

FIG. 5A is a top view illustrating a fifth configuration of a computer system (i.e., a third "partial" configuration); FIG. 5B is a front or back view illustrating a configurable baffle 514 installed in the fifth configuration; and FIG. 5C is a section view illustrating the configurable baffle 514 installed in the fourth configuration. The computer system configuration depicted in FIGS. 5A-5C is used herein as a non-limiting example of a computer system configuration for which embodiments may be implemented.

FIGS. 5A-5C illustrate a third "partial" computer system 501 configuration comprising an enclosure 102 enclosing a single heat sink 104 associated with a corresponding processor 106 installed in a corresponding processor socket 107, an empty processor socket 107, four memory modules 108 on only one side of heat sink 104 and processor 106 and installed in corresponding memory module sockets 109, four empty memory module sockets 109, a printed circuit assembly 110 to which processor 106 and memory modules 108 are communicatively coupled, a cooling fan 112 and a configurable air baffle 514.

Note that all the memory module sockets 109 on only one side (left side as depicted in FIG. 5A) of the system 501 actually house memory modules 108. Therefore, in the configuration depicted, memory module sockets 109 on the other side (right side as depicted in FIG. 5A) are not used to house corresponding memory modules 108. Furthermore, only one processor 106 and associated heat sink 104 (left side as depicted in FIG. 5A) are installed in system 501. Consequently, if air baffle 114 is used with the configuration of FIG. 5A, the forced airflow from cooling fan 112 would take a different path than the forced airflow would take with the configuration of FIG. 1A. As discussed in reference to computer system 301 with air baffle 114, the airflow would tend toward paths over the unused memory module sockets 109, thus bypassing to a large extent the installed components (i.e., left-side memory modules 108, left-side processor 106 and left-side heat sink 104), which is not a desirable scenario for the same reasons.

FIGS. 5B and 5C illustrate an embodiment in which two blocks 520 and 521 are coupled to air baffle 514. Blocks 520 and 521 are also referred to herein as a flow impedance device because the block impedes the airflow in certain areas in which the block is located. In the configuration of FIGS. 5B and 5C, blocks 520 and 521 are coupled to air baffle 514 so that the blocks 520 and 521 generally block airflow to the vacant volume above each unused memory module socket 109 and processor socket 107, respectively. Block 520 is generally installed longitudinally perpendicular to the airflow, near the front of the empty memory module sockets 109, and block 521 is generally installed longitudinally parallel to the airflow, over the empty processor socket 107. By impeding, or blocking, the airflow around the corresponding volumes that blocks 520 and 521 fill, more of the forced airflow from cooling fan 112 is directed to flow over and around the components actually installed in the system 501. Configurable baffle 514 may be the same baffle as configurable baffles 314 and 414, but with blocks configured differently, i.e., the same 'main' baffle structure may be used with different attached flow impedance device configurations.

Blocks 520 and 521 are depicted as removably attached to air baffle 514 via housing receptacles inset in air baffle 514. Thus, a user in the field is able to configure air baffle 514 and attached blocks 520 and 521 in a manner according to the specific configuration of computer system 501. Hence, if the configuration of system 501 is changed, then the configuration of blocks on air baffle 514 can be changed accordingly. The housing receptacles, according to one embodiment, are shown in greater detail in FIG. 6B.

As discussed, blocks 520 and 521 may be permanently attached rather than removably attached to air baffle 514. Further, blocks 520 and 521 may be attached to air baffle 514 in a prefabricated "factory" configuration by the baffle manufacturing process (e.g., molded with the baffle) so that unnecessary blocks can be removed (e.g., broken off) from air baffle 514 according to the specific component configuration of computer system 501, i.e., the preconfigured blocks that would otherwise interfere with installed components are removed from the "factory-configured" air baffle 514 prior to installing air baffle 514 into system 501.

Examples of Flow Impedance Devices

FIGS. 7A-7G are front bottom isometric views of flow impedance devices, according to various embodiments. The flow impedance devices illustrated in FIGS. 7A-7G are presented as non-limiting examples of various shapes and sizes that may be used with a configurable air baffle. However, as described herein, the exact shape and size of flow impedance devices used may vary based on the airflow needs associated with a different computer system component configurations and, therefore, may vary from implementation to implementation. The isometric views illustrated in FIGS. 7A-7G are illustrated in orientations relative to the direction of the airflow, where the associated air flows in a direction from the lower left to the upper right of the FIGS. 7A-7G. In the further descriptions of FIGS. 7A-7G, the flow impedance devices are simply referred to as "blocks."

Figure 7A:
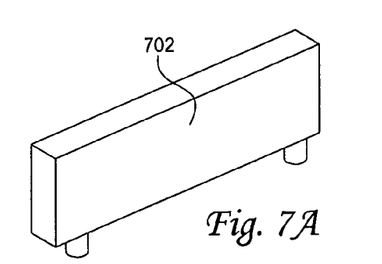
FIGS. 7A-7G are front bottom isometric views of flow impedance devices, according to various embodiments.

FIG. 7A depicts a block 702 for coupling with a configurable air baffle in a direction longitudinally parallel to the direction of the airflow, similar to the blocks 320 of air baffle 314 (FIG. 3B, FIG. 3C). The exact dimensions of block 702 may vary based on the airflow needs associated with a given computer system component configuration and, therefore, may vary from implementation to implementation.

Figure 7B:
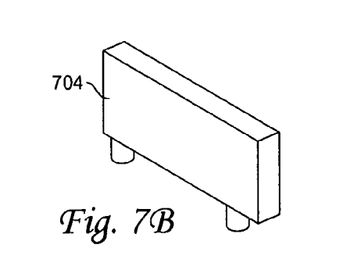

FIG. 7B depicts a block 704 for coupling with a configurable air baffle in a direction longitudinally perpendicular to the direction of the airflow, similar to block 420 of air baffle 414 (FIG. 4B, FIG. 4C) and block 520 of air baffle 514 (FIG. 5B, FIG. 5C). The exact dimensions of block 704 may vary based on the airflow needs associated with a given computer system component configuration and, therefore, may vary from implementation to implementation.

Figure 7C:
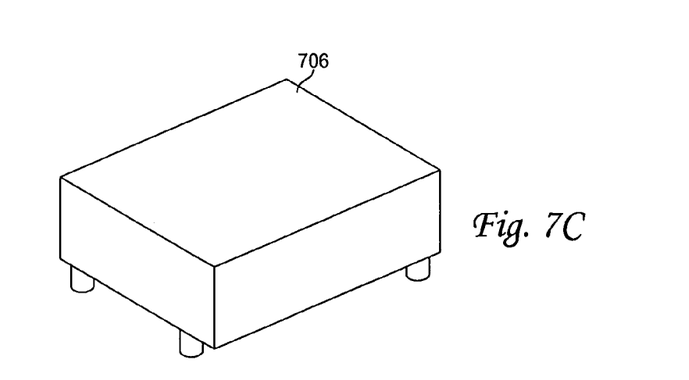

FIG. 7C depicts a block 706 for coupling with a configurable air baffle in a direction longitudinally parallel to the direction of the airflow, similar to block 521 of air baffle 514 (FIG. 5B, FIG. 5C). The exact dimensions of block 706 may vary based on the airflow needs associated with a given computer system component configuration and, therefore, may vary from implementation to implementation.

Figure 7D:
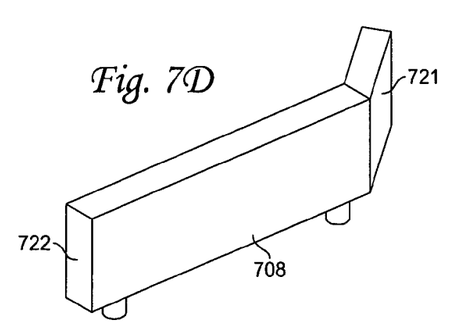

FIG. 7D depicts a block 708 for coupling with a configurable air baffle in a direction longitudinally parallel to the direction of the airflow. Block 708 has a more complex shape than blocks 702-706, i.e., block 708 has a second leg 721 at an angle to a first leg 722. For example, in reference to FIGS. 3B and 3C, a computer system may include a component installed downstream of the processor 106, heat sink 104, and memory modules 108. Thus, use of block 708 to fill the space of a missing memory module, for example, functions to redirect the airflow beyond the memory module sockets 109, such as toward the downstream component. The exact dimensions of block 708 may vary based on the airflow needs associated with a given computer system component configuration and, therefore, may vary from implementation to implementation.

Figure 7E:
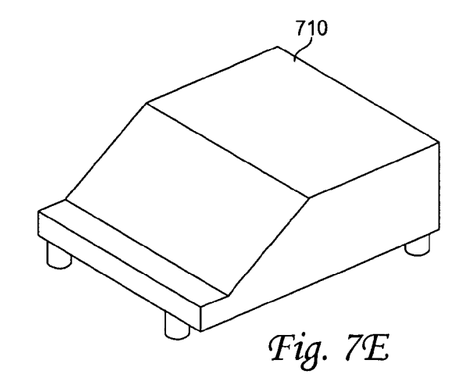

FIG. 7E depicts a block 710 for coupling with a configurable air baffle in a direction longitudinally parallel to the direction of the airflow. Block 710 has a more complex shape than blocks 702-706. Thus, a block such as block 710 can be used to further direct the airflow in a downward direction, producing an additional baffle affect. For example, a computer system may include memory modules with less height on one side of the computer system than the other side. Thus, use of block 710 to fill the space above the smaller memory modules, for example, functions to further direct the airflow down toward the smaller modules. The exact dimensions of block 710 may vary based on the airflow needs associated with a given computer system component configuration and, therefore, may vary from implementation to implementation.

Figure 7F:
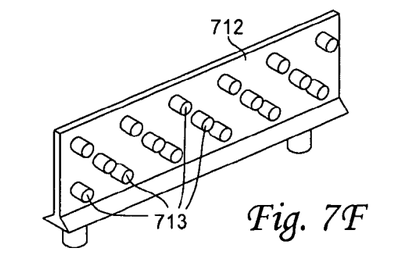

FIG. 7F depicts a block 712 for coupling with a configurable air baffle in a direction longitudinally parallel to the direction of the airflow. Block 712 comprises a set of nodules, nubbins, or similar protrusions 713, protruding from the planar surface of the block. A block such as block 712 can be used to create turbulence in the airflow flowing over, around and past the block 712, because turbulent airflow is generally more effective at cooling components than laminar airflow. For example, a computer system may include a vacuum cooling system in which the fans are located at the back of the system rather than at the front of the system and, therefore, generate a more laminar flow of air through the components located at the front of the system by pulling air through the system. Thus, use of block 712 functions to agitate the airflow near and downstream of the block 712. The exact dimensions of block 712 may vary based on the airflow needs associated with a given computer system component configuration and, therefore, may vary from implementation to implementation.

Figure 7G:
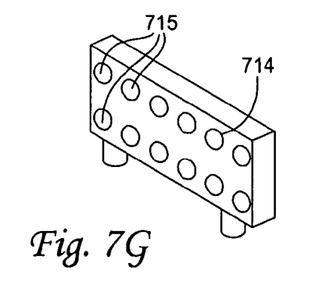

FIG. 7G depicts a block 714 for coupling with a configurable air baffle in a direction longitudinally perpendicular to the direction of the airflow. Block 714 comprises a set of holes 715 through the planar surface of the block. A block such as block 714 can be used to create turbulence in the airflow flowing over, around and past the block 714, as well as to allow for some airflow through the block 714 in situations in which total local airflow blockage is not desired. The exact dimensions of block 714 may vary based on the airflow needs associated with a given computer system component configuration and, therefore, may vary from implementation to implementation.

What is claimed is:

1. A baffle for affecting airflow through a computer system, the baffle comprising:
    a planar portion having a plurality of housing receptacles arranged in a grid-like pattern; and
    one or more flow impedance devices attachable to said planar portion, each of the one or more flow impedance devices having at least one attachment stub for fitting within one of said housing receptacles to attach said one or more flow impedance devices to said planar portion;
    wherein the grid-like arrangement of said plurality of housing receptacles enables a user to attach said one or more flow impedance devices to said planar portion at various locations and in various orientations, thereby enabling the user to arrange said one or more flow impedance devices to affect airflow through the computer system in a manner desired by the user.

2. The baffle of claim 1, wherein said plurality of housing receptacles are on an underside of said planar portion.

3. The baffle of claim 1, wherein at least one of said one or more flow impedance devices is a rectangular parallelepiped.

4. The baffle of claim 1, wherein at least one of said one or more flow impedance devices is a polyhedron whose faces are parallelograms.

5. The baffle of claim 4, wherein said polyhedron is hollow.

6. The baffle of claim 1, wherein at least one of said one or more flow impedance devices is a block.

7. The baffle of claim 1, wherein at least one of said one or more flow impedance devices comprises at least one protuberance configured to cause turbulence in said airflow.

8. The baffle of claim 1, wherein at least one of said one or more flow impedance devices has at least one hole configured to allow some of said airflow to flow through said at least one flow impedance device.

9. The baffle of claim 1, wherein at least one of said one or more flow impedance devices comprises a first leg and a second leg coupled to said first leg, and wherein said first leg is at an obtuse angle to said second leg.

10. The baffle of claim 1, wherein at least a particular flow impedance device of said one or more flow impedance devices comprises a relatively wide face and a relatively narrow face, and wherein said particular flow impedance device is attachable to said planar portion such that said wide face is positioned substantially perpendicular to the airflow through the computer system.

11. The baffle of claim 1, wherein at least a particular flow impedance device of said one or more flow impedance devices comprises a relatively wide face and a relatively narrow face, and wherein said particular flow impedance device is attachable to said planar portion such that said wide face is positioned substantially parallel to the airflow through the computer system.

12. A baffle for affecting airflow through a computer system, the baffle comprising:
    a planar portion; and
    a plurality of flow impedance devices attached to said planar portion in a preconfigured arrangement, wherein at least same of said plurality of flow impedance devices are permanently removable from said planar portion such that once a flow impedance device is removed, the removed flow impedance device can not be put back into place;
    wherein a user is allowed to permanently remove one or more of said plurality of flow impedance devices from said planar portion to affect airflow through the computer system in a manner desired by the user.

13. The baffle of claim 12, wherein at least one of said plurality of flow impedance devices is a rectangular parallelepiped.

14. The baffle of claim 12, wherein at least one of said plurality of flow impedance devices is a block.

15. The baffle of claim 12, wherein at least a particular flow impedance device of said plurality of flow impedance devices comprises a relatively wide face and a relatively narrow face, and wherein said particular flow impedance device is positioned such that said wide face is substantially perpendicular to the airflow through the computer system.

16. The baffle of claim 12, wherein at least a particular flow impedance device of said plurality of flow impedance devices comprises a relatively wide face and a relatively narrow face, and wherein said particular flow impedance device is positioned such that said wide face is substantially parallel to the airflow through the computer system.

17. An assembly, comprising:
an enclosure;
a printed circuit assembly situated within said enclosure, said printed circuit assembly supporting one or more processors and one or more memory modules;
one or more fans for forcing airflow through said enclosure; and
a baffle for affecting the airflow through said enclosure, said baffle comprising:
a planar portion having a plurality of housing receptacles arranged in a grid-like pattern; and
one or more flow impedance devices attached to said planar portion, each of the one or more flow impedance devices having at least one attachment stub for fitting within one of said housing receptacles to attach said one or more flow impedance devices to said planar portion;
wherein the grid-like arrangement of said plurality of housing receptacles enables a user to attach said one or more flow impedance devices to said planar portion at various locations and in various orientations, thereby enabling the user to arrange said one or more flow impedance devices to affect the airflow through said enclosure in a manner desired by the user.

18. The assembly of claim 17, wherein at least one of said one or more flow impedance devices is a rectangular parallelepiped.

19. The assembly of claim 17, wherein at least a particular flow impedance device of said one or more flow impedance devices comprises a relatively wide face and a relatively narrow face, and wherein said particular flow impedance device is attached to said planar portion such that said wide face is positioned substantially perpendicular to the airflow through said enclosure.

20. The assembly of claim 17, wherein at least a particular flow impedance device of said one or more flow impedance devices comprises a relatively wide face and a relatively narrow face, and wherein said particular flow impedance device is attached to said planar portion such that said wide face is positioned substantially parallel to the airflow through said enclosure.

* * * * *

UNITED STATES PATENT AND TRADEMARK OFFICE
CERTIFICATE OF CORRECTION

| | |
|---|---|
| PATENT NO. | : 7,474,528 B1 |
| APPLICATION NO. | : 11/401611 |
| DATED | : January 6, 2009 |
| INVENTOR(S) | : Timothy W. Olesiewicz et al. |

It is certified that error appears in the above-identified patent and that said Letters Patent is hereby corrected as shown below:

Column 10, Claim 12, line 58, delete "same" and insert --some--.

Signed and Sealed this

Twenty-first Day of April, 2009

JOHN DOLL
*Acting Director of the United States Patent and Trademark Office*